US009914997B2

(12) United States Patent
Koller et al.

(10) Patent No.: US 9,914,997 B2
(45) Date of Patent: Mar. 13, 2018

(54) METHOD FOR SUPPLYING A PROCESS WITH AN ENRICHED CARRIER GAS

(71) Applicant: OSRAM OPTO SEMICONDUCTORS GMBH, Regensburg (DE)

(72) Inventors: Andreas Koller, Regensburg (DE); Alexander Behres, Pfatter (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 196 days.

(21) Appl. No.: 14/772,679

(22) PCT Filed: Mar. 28, 2014

(86) PCT No.: PCT/EP2014/056331
§ 371 (c)(1),
(2) Date: Sep. 3, 2015

(87) PCT Pub. No.: WO2014/166766
PCT Pub. Date: Oct. 16, 2014

(65) Prior Publication Data
US 2016/0017489 A1    Jan. 21, 2016

(30) Foreign Application Priority Data
Apr. 10, 2013  (DE) ........................ 10 2013 103 603

(51) Int. Cl.
C23C 16/18     (2006.01)
C23C 16/448    (2006.01)
C23C 16/52     (2006.01)
B01D 1/14      (2006.01)

(52) U.S. Cl.
CPC ............. *C23C 16/4482* (2013.01); *B01D 1/14* (2013.01); *C23C 16/18* (2013.01); *C23C 16/4481* (2013.01); *C23C 16/52* (2013.01)

(58) Field of Classification Search
CPC ....... B01D 1/14; C23C 16/18; C23C 16/4481; C23C 16/4482; C23C 16/52
USPC ......... 261/122.1, 122.2, 124, 125, 128, 129, 261/130, 131
See application file for complete search history.

(56) References Cited

U.S. PATENT DOCUMENTS 4,140,735 A    2/1979  Schumacher
4,276,243 A *  6/1981  Partus .................... B01J 4/008
                                                  236/12.12

(Continued)

FOREIGN PATENT DOCUMENTS

WO    WO 2010/103487    9/2010

*Primary Examiner* — Charles Bushey
(74) *Attorney, Agent, or Firm* — Cozen O'Connor

(57) ABSTRACT

A method for supplying a process with an enriched carrier gas. A first apparatus and a second apparatus are provided. The first apparatus has a precursor and is configured to bring a carrier gas into contact with the precursor and to enrich the carrier gas with the precursor. The second apparatus has a precursor and is configured to bring a carrier gas into contact with the precursor and to enrich the carrier gas with the precursor. The first apparatus supplies the second apparatus with an enriched carrier gas. The second apparatus supplies the enriched carrier gas for the process. A temperature of the first apparatus is controlled as a function of a quantity of precursor in the second apparatus.

15 Claims, 4 Drawing Sheets

(56) References Cited

U.S. PATENT DOCUMENTS

| | | | |
|---|---|---|---|
| 4,450,118 A * | 5/1984 | Tuin | B01J 4/008 |
| | | | 261/119.1 |
| 4,582,480 A | 4/1986 | Lyncgh et al. | |
| 5,078,922 A | 1/1992 | Collins et al. | |
| 6,135,433 A * | 10/2000 | Nurmi | C23C 16/448 |
| | | | 261/122.1 |
| 6,161,398 A | 12/2000 | Partus | |

\* cited by examiner

METHOD FOR SUPPLYING A PROCESS WITH AN ENRICHED CARRIER GAS

RELATED APPLICATIONS

This is a U.S. National Phase Application under 35 USC 371 of International Application PCT/EP2014/056331 filed on Mar. 28, 2014.

This application claims the priority of German application no. 10 2013 103 603.1 filed Apr. 10, 2013, the entire content of which is hereby incorporated by reference.

FIELD OF THE INVENTION

A method is provided for supplying a process with an enriched carrier gas. Also provided for enriching a carrier gas is a bubbler suitable for use with such a method. A system is further provided which has a first and a second bubbler and a controller for controlling a temperature of an apparatus for enriching a carrier gas.

BACKGROUND OF THE INVENTION

Document U.S. Pat. No. 4,140,735 A describes a method for supplying a process with a carrier gas.

SUMMARY OF THE INVENTION

One object of the present invention is to provide an improved method for supplying a process with an enriched carrier gas. A further object is to provide an improved apparatus for enriching a carrier gas. A further object is to provide an improved system for supplying an enriched carrier gas. In addition, a further object is to provide improved control of the method for supplying an enriched carrier gas.

To enrich a carrier gas, devices may be used which for example take the form of bubblers with liquid precursors. The carrier gas flows through the liquid precursor, such that molecules of the precursor are entrained in the carrier gas. Instead of a liquid precursor, however, a solid precursor may also be provided. The described method is for example used to grow semiconductor layers with the assistance of a MOVPE or a CVD system.

Organometallic liquid precursors are for example used as the precursor. The described method is used for example to produce semiconductor layers for semiconductor lasers and LED structures.

An advantage of the described method consists in being able to provide large volumetric flow rates of the carrier gas. In addition, large volumetric flow rates of the carrier gas may be provided with a constant concentration of precursor.

The novel bubbler has the advantage that large volumetric flow rates of carrier gas may be provided with a constant saturation of precursor.

The advantage of the described method is achieved in that a first apparatus for enriching a carrier gas with a precursor is provided, wherein the first apparatus conveys an enriched carrier gas to a second apparatus. The second apparatus is likewise configured to enrich a carrier gas with a precursor. The second apparatus conveys the carrier gas enriched thereby on to a process, for example a layer deposition process for optoelectronic semiconductor devices. A temperature of the first apparatus, which determines the enrichment concentration of the carrier gas with the precursor of the first apparatus, is controlled as a function of a quantity of precursor in the second apparatus. In this way, safe and reliable enrichment of the carrier gas is achieved in the second apparatus even at a high carrier gas volumetric flow rate with a constant concentration of the enriched precursor in the carrier gas. Thus, carrier gas flow rates can be achieved of for example greater than one liter per minute up to for example 10 liters per minute or more with a constant concentration of precursor. Increased stabilisation of the deposition process and a high deposition rate are thus also achieved with a source for the enriched carrier gas.

In a further embodiment the second apparatus is filled with precursor using the first apparatus. This is achieved in that the temperature of the first apparatus is set such that more precursor is transported from the first apparatus to the second apparatus via the carrier gas than is output by the second apparatus via the carrier gas to the process. It is thus not necessary, after first filling with precursor, to fill the second apparatus continuously with precursor during operation. The second apparatus is for example filled with a precursor up to a fixed filling level at the start of a process. During the process the second apparatus is supplied with precursor by means of the first apparatus. Since sufficient precursor is held in the second apparatus, the carrier gas may moreover be enriched with precursor even if the precursor of the first apparatus is consumed. An emptied first apparatus may thus be replaced with a new, full apparatus without any negative effect on the enrichment process by the second apparatus. It is additionally more easily possible to perform maintenance on the first apparatus without affecting the supply of enriched carrier gas by the second apparatus.

In a further embodiment, exact control of the temperature of the first apparatus is achieved. To this end, the temperature of the first apparatus is controlled as a function of the quantity of precursor in the second apparatus. In this way, a desired filling level of the precursor in the second apparatus may be maintained or established.

In a further embodiment the method is simplified such that the quantity of precursor in the second apparatus is gauged as a function of the weight of the second apparatus. It is thus unnecessary actually to measure the current precursor filling level. All that is needed is simple measurement of the weight of the second apparatus. In a further embodiment, the temperature of the second apparatus is controlled independently of the temperature of the first apparatus. In particular, control is performed as a function of the quantity of precursor in the second apparatus and/or as a function of the volumetric flow rate of the carrier gas through the second apparatus and/or as a function of a desired saturation of the carrier gas for the process.

The described method may for example be used for a liquid precursor, in particular for an organometallic precursor. It is advantageous, in particular when using a liquid precursor, that filling of the second apparatus is not required. Filling of an apparatus with a liquid precursor, i.e. a bubbler, is relatively complex and can be avoided with the described system.

The described bubbler has the advantage that a high volumetric flow rate of carrier gas may be supplied constantly with a precursor, in particular with a constant saturation of the precursor. This is achieved in particular in that at least one deflection element is provided in the liquid precursor, and the flow of carrier gas in the precursor is influenced such that the carrier gas forms a larger surface area and/or must cover a longer distance, i.e. is in contact with the precursor for a longer time. This is achieved, for example, in that the deflection element takes the form of a plate with orifices. The orifices may for example take the form of holes. The size of the orifices is, for example, smaller than a bubble formed by the carrier gas in a liquid precursor. In particular, the deflection element may take the form of a screen. The configuration of the orifices assists in the formation of small bubbles of carrier gas in the liquid precursor. This increases the surface area of the carrier gas. Higher saturation of the carrier gas with the precursor may thus also be achieved at a high carrier gas volumetric flow rate.

In a further embodiment, the deflection element is configured such that the travel of the carrier gas in the precursor is increased. This is achieved, for example, in that the deflection element takes the form of a plate with slots. In particular, the plate may have faces which take the form of segments of a circle and are arranged preferably at an inclination to a plane of the plate. In this way, the carrier gas is forced into transverse travel, in particular into a circular and/or spiral flow path.

Preferably, a plurality of deflection elements are arranged one above the other. Thus, further enlargement of the surface area of the carrier gas and/or further carrier gas turbulence in the precursor is achieved. This brings about a further enlargement of the surface area of the carrier gas and/or an extension of the distance traveled by the carrier gas. The described system with a first and a second bubbler has the advantages explained with reference to the method.

A simple and inexpensive bubbler construction with reliable temperature control is achieved in that the bubbler has a cooling sleeve attached to the outside thereof. The temperature of the bubbler may thus on the one hand be adjusted sufficiently precisely with the assistance of a cooling liquid. In addition, control of the bubbler temperature may be adjusted by simple control of the cooling stream. Furthermore, a closed coolant stream may be used, such that no coolant can evaporate.

The described control has the advantage of enabling the described method to be performed simply and reliably.

BRIEF DESCRIPTION OF THE DRAWINGS

The above-described characteristics, features and advantages of this invention and the manner in which these are achieved will become clearer and more distinctly comprehensible from the following description of the exemplary embodiments, which are explained in greater detail in connection with the drawings, in which

DETAILED DESCRIPTION OF THE DRAWINGS

Figure 1:
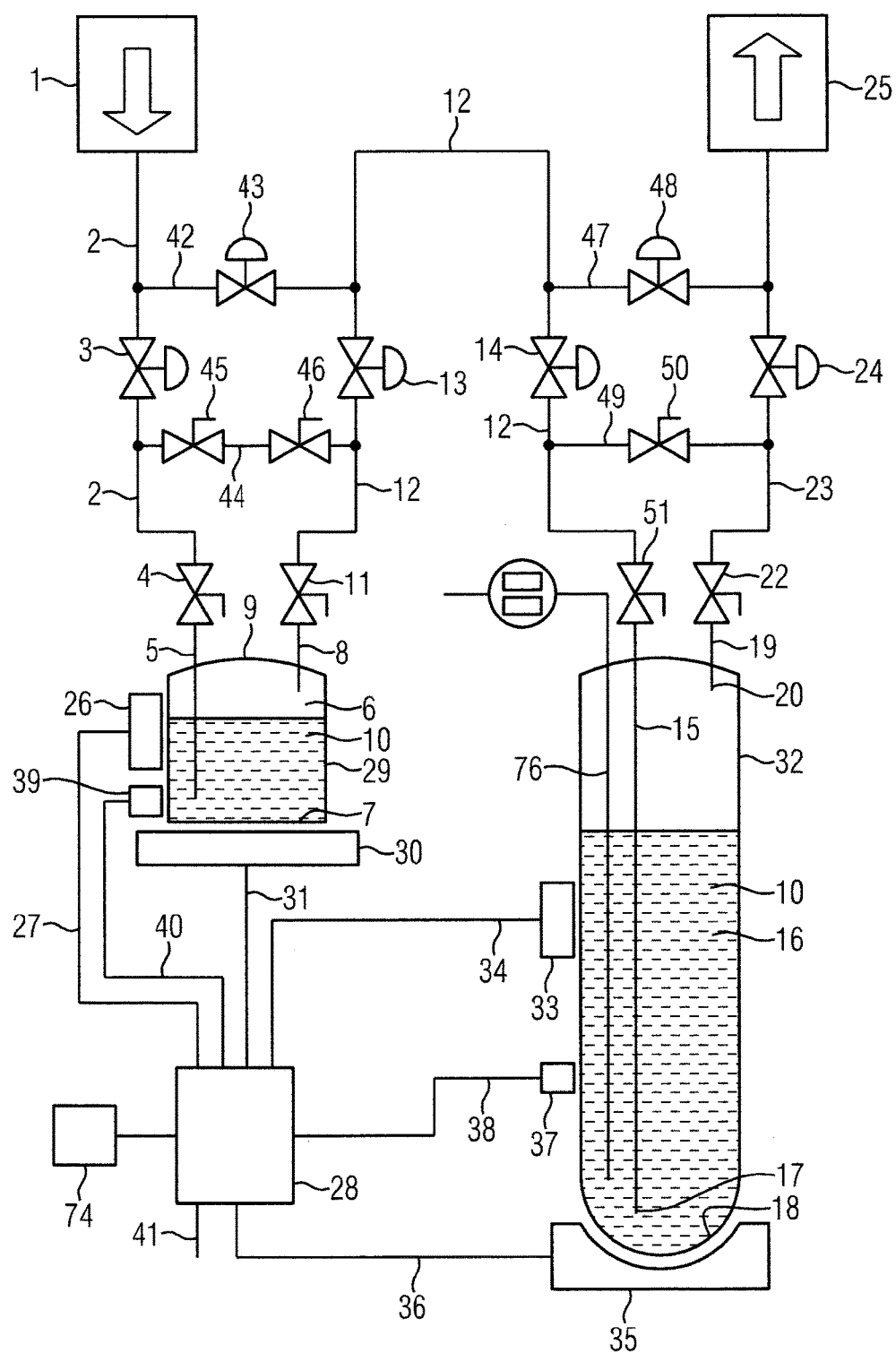
Figure 2:
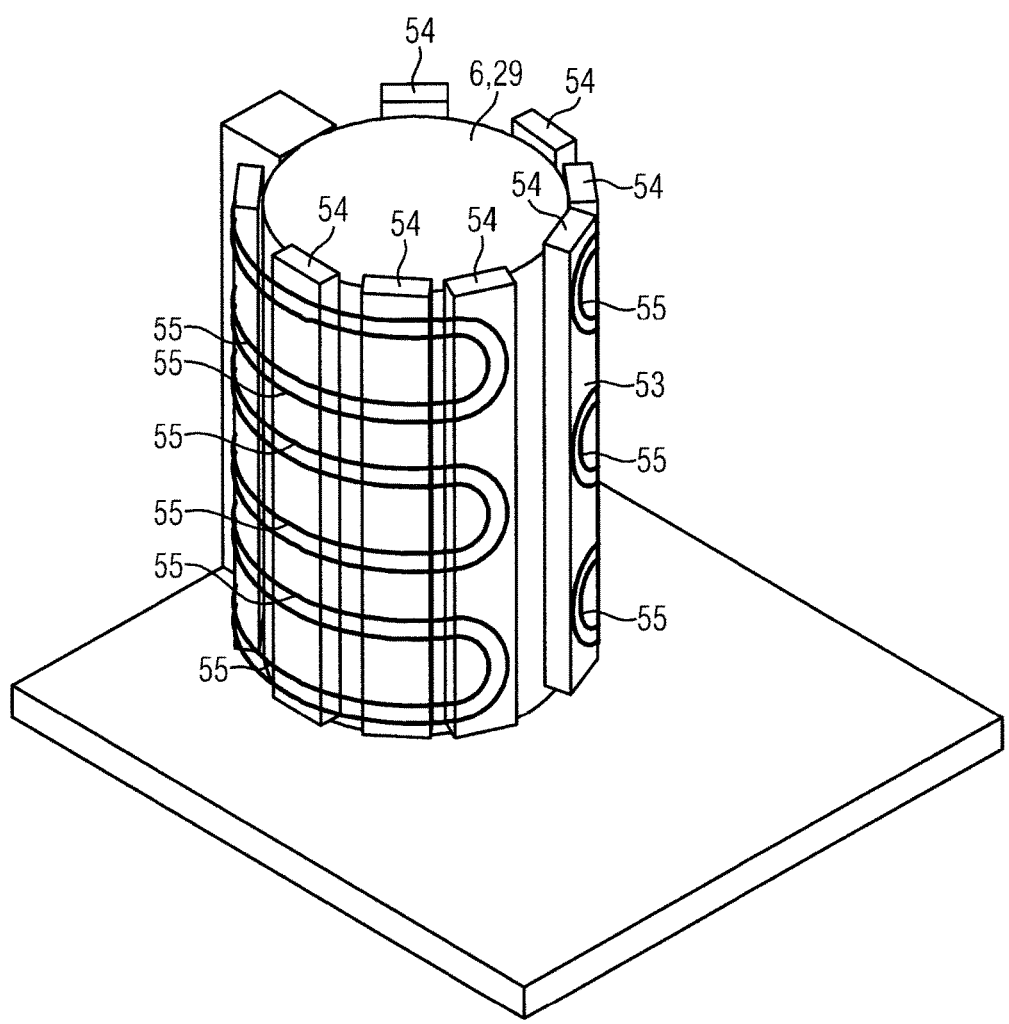
Figure 3:
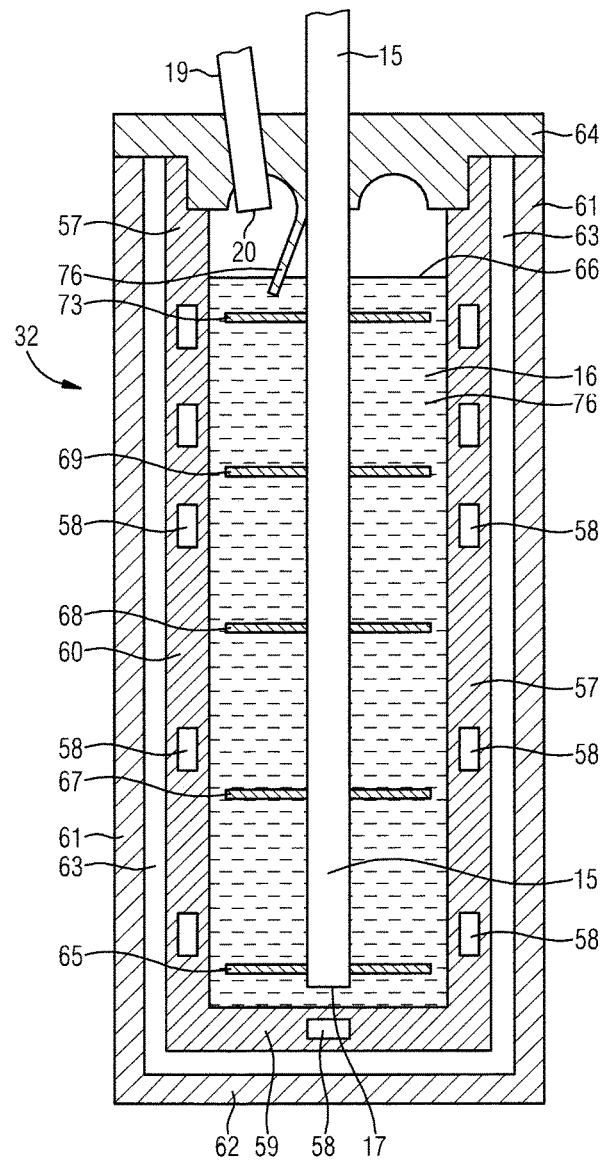
Figure 4:
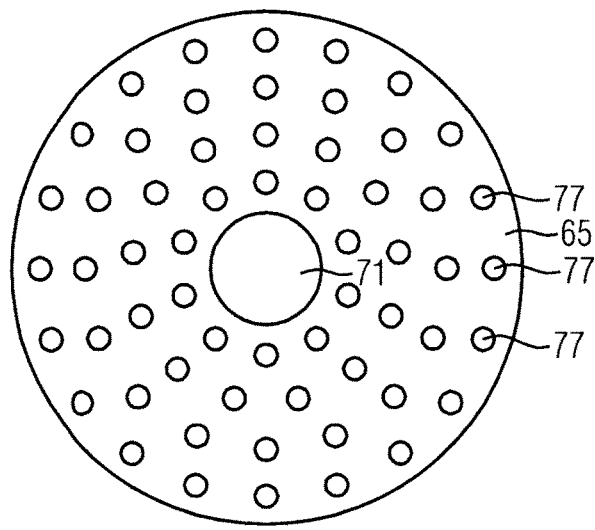
Figure 5:
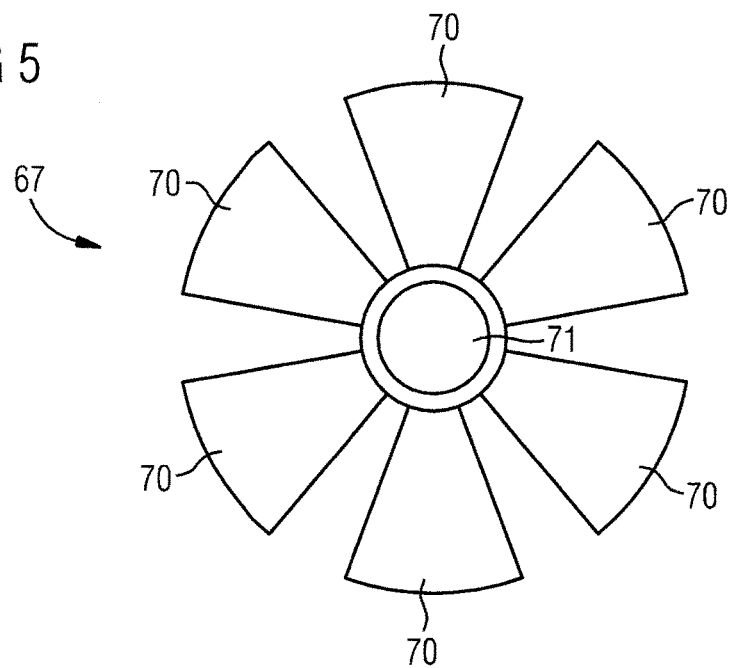
Figure 6:
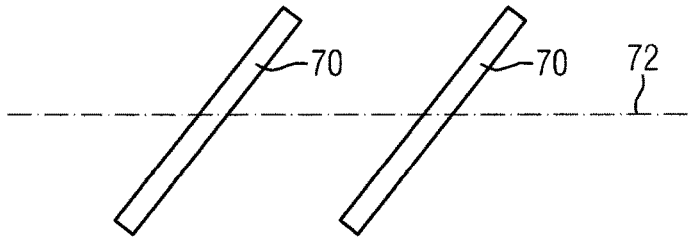

FIG. 1 is a schematic representation of a system with two apparatuses for enriching a carrier gas with a precursor, FIG. 2 shows a bubbler with a cooling sleeve, FIG. 3 shows a schematic cross-section through an apparatus for enriching a carrier gas with a precursor, FIG. 4 is a schematic plan view of the first deflection element, FIG. 5 is a schematic plan view of a deflection element, and FIG. 6 is a schematic side view of the deflection element of FIG. 5.

FIG. 1 is a schematic representation of an arrangement for enriching a carrier gas with a precursor. The carrier gas may for example be provided in the form of argon or helium by a source 1 at a predetermined pressure. The source 1 is connected to a feed line 2. The feed line 2 is connected with a first inlet valve 4 via a first valve 3. The first inlet valve 4 connects the feed line 2 with an inflow pipe 5, which leads into a chamber 6 of a vessel 29. The inflow pipe 5 ends just above the bottom 7 of the chamber 6. In addition, an outflow pipe 8 passes into the chamber 6, said outflow pipe 8 ending just below a top wall 9. In the operating state, a precursor 10 is present in the chamber 6. The precursor 10 may for example be in solid form or liquid form. An organometallic compound may, for example, be used as the precursor 10.

The outflow pipe 8 is connected to a connecting line 12 via a first outlet valve 11. The connecting line 12 comprises a second and a third valve 13, 14. The second and third valves 13, 14 are connected in series one after the other. Downstream of the third valve 14 the connecting line 12 is connected to a second inlet valve 51. The second inlet valve 51 connects the connecting line 12 to a second inflow pipe 15. The second inflow pipe 15 passes into a second chamber 16 of a second vessel 32. The second inflow pipe 15 ends with an outlet orifice 17 close to a second bottom 18 of the second chamber 16. In addition, a second outflow pipe 19 passes out of the second chamber 16, wherein an outflow orifice 20 is arranged just below a second top wall 21 of the second chamber 16. The second outflow pipe 19 is connected to a discharge line 23 via a second outlet valve 22. A fourth valve 24 is provided in the discharge line 23. Downstream of the fourth valve 24 the discharge line 23 leads into a process chamber 25.

When the installation is in operation, the same type of precursor is provided in the second chamber 16 as in the first chamber 6. The precursor 10 may for example be provided in the form of a liquid precursor. When in operation, the liquid precursor has a filling level which is arranged between the outlet orifice 17 of the second inflow pipe 15 and the outflow orifice 20 of the second outflow pipe 19.

Furthermore, the first chamber 6 comprises a temperature control means 26. Using the temperature control means 26, the temperature in the chamber 6 and thus the temperature of the precursor 10 may be influenced, in particular adjusted. The temperature control means 26 is connected to a control device 28 via a control line 27. The control device 28 is connected to a data memory 74. The chamber 6 is defined by the sealed vessel 29, wherein carrier gas is supplied via the inflow pipe 5 and removed via the outflow pipe 8. In the embodiment illustrated, the vessel 29 is arranged on a balance 30. The balance 30 is connected to the control device 28 via a signal line 31.

The second chamber 16 is formed by the second sealed vessel 32, wherein carrier gas is fed in via the second inflow pipe 15 and removed via the second outflow pipe. The second vessel 32 comprises a second temperature control means 33, for adjusting the temperature of the second vessel. The second temperature control means 33 is connected to the control device 28 via a second control line 34. Furthermore, the second vessel 32 is arranged on a second balance 35. The second balance 35 is connected to the control device 28 via a second signal line 36. In addition, a second temperature sensor 37 may be provided on or in the second vessel 32. The second temperature sensor 37 is connected to the control device 28 via a third signal line 38. In addition, the vessel 29 may comprise a first temperature sensor 39, which is connected to the control device 28 via a fourth signal line 40.

By means of the balances 30, 35, the weight of the vessels 29, 32 and thus the quantity of precursor in the vessels 29, 32 may be determined. The control device 28 further comprises in-/outputs 41, via which signals from further sensors are detected and/or control signals are output to the valves.

When viewed in the direction of flow of a carrier gas, a bypass line 42 with a fifth valve 43 is arranged upstream of the first valve 3. The bypass line 42 joins the connecting line 12 downstream of the second valve 13 and upstream of the third valve 14 in the direction of flow. In addition, a second bypass line 44 with a first and a second switching valve 45, 46 is provided, which connects the feed line 2 to the connecting line 12 respectively adjacent to the first inlet valve 4 and the first outlet valve 11. Furthermore, a third bypass line 47 is provided, which has sixth valve 48. The third bypass line 47 connects the feed line 12 upstream of the third valve 14 when viewed in the direction of flow with the discharge line 23 downstream of the fourth valve 24.

Furthermore, a fourth bypass line 49 is provided which has a third switching valve 50, wherein the fourth bypass line 49 connects the feed line 12 upstream of the second inlet valve 51 when viewed in the direction of flow with the discharge line 23 downstream of the second outlet valve 22 when viewed in the direction of flow. The out- and inlet valves 4, 11, 51, 52 likewise take the form of switching valves, wherein a switching valve is switched manually. The other valves 3, 13, 14, 24, 43, 48 each take the form of pneumatic valves, which are actuated by the control device 28, i.e. opened or closed.

By means of the apparatus described in FIG. 1, a process chamber 25 may be supplied with a desired volumetric flow rate of a carrier gas with desired precursor enrichment. To this end, corresponding programs are saved in the data memory 74 for the control device 28. Enrichment of the carrier gas as it flows through the first chamber 6 and the second chamber 16 depends on the flow velocity of the carrier gas and the temperature of the precursor 10. Corresponding tables are saved in the data memory 74. The carrier gas is provided by the source 1 at a predetermined pressure. Depending on the desired volumetric flow rate of the carrier gas, the first, second, third and fourth valves 3, 13, 14, 24 are opened as appropriate. The inlet and outlet valves 4, 11, 51, 52 are likewise opened. The switching valves 45, 46, 50 of the second and fourth bypass lines 44, 49 are closed in normal operation. The fifth valve 43 and the sixth valve 48 are likewise closed in normal operation.

The temperature of the precursor 10 is detected in the first and a second chamber 6, 16 by the temperature sensors 37, 39. Depending on the predetermined volumetric flow rate and desired enrichment with the precursor, the temperatures of the precursors 10 in the first and second chambers 6, 16 are adjusted to the desired level by the control device 28 by corresponding activation of the temperature control means 26, 33. In addition, saturation of the carrier gas in the second chamber 16 depends on the precursor filling level. To this end, corresponding programs and tables are saved in the data memory 74.

To maintain a desired filling level of the precursor 10 in the second chamber 16, the temperature of the precursor 10 in the first chamber 6 is set to be higher than is needed for saturation of the carrier gas. Thus, more precursor is conveyed via the carrier gas and the connecting line 12 from the chamber 6 into the second chamber 16 than is passed by the carrier gas via the second discharge line 23 from the second chamber 16 to the process chamber 25. This increases the precursor filling level in the second chamber 16. To detect the filling level of the precursor 10 in the second chamber 16, the weight of the second vessel 32 is detected using the second balance 35 and signalled to the control device 28. Tables are saved in the data memory 74 which calculate a filling level as a function of the detected weight of the second vessel 32. In addition, using the balance 30 the weight of the first vessel 29 is detected and signalled on to the control device 28. On the basis of the weight of the vessel 29, the control device 28 determines the filling level of the precursor 10 in the chamber 6. Depending on the selected embodiment, it is possible, instead of balances 30, 35, also to use other measurement methods to measure the filling level or the quantity of precursor 10 in the first and/or in the second chambers 6, 16. The first and second vessels each constitute an apparatus for enriching a carrier gas with a precursor in the form of a bubbler.

To produce compound semiconductors, organometallic compounds such as for example trimethylgallium, trimethylaluminium, trimethylindium, dimethylhydrazine etc. are often used. The advantage of these compounds is moderate vapour pressure at room temperature, such that they can be evaporated under close to standard conditions and transported by pipes. When using a liquid precursor, the vessels 29, 32 illustrated in FIG. 1 constitute "bubblers", which from the point of view of basic structure correspond to a gas washing bottle. In this case, the organometallic compounds are transported to a process chamber 25 under saturated steam via a liquid organometallic compound or a solid organometallic compound through the introduction of a carrier gas, such as for example hydrogen, nitrogen or argon. For defined enrichment, i.e. a defined concentration of the precursor in the carrier gas, a specific precursor temperature is needed. To this end, the vessels 29, 32 are kept as far as possible at precisely the desired temperature by the temperature control means 26, 33, in order to achieve a defined constant vapour pressure of the organometallic precursor. Trimethylaluminium may for example be used for the deposition of aluminium, trimethylgallium for the deposition of gallium, trimethylindium for the deposition of indium, isobutylgermanium for the deposition of germanium and arsines for the deposition of arsenic.

FIG. 2 is a schematic representation of the vessel 29, which represents an apparatus for enriching a carrier gas with a precursor and is constructed in accordance with FIG. 1. The vessel 29 comprises as temperature control means 26 a cooling sleeve 53 which has a cooling line 55 for conveying a cooling medium. The cooling sleeve 53 is connected, for example, with a closed cooling water circuit, whereby temperature control of the vessel 29 and thus of the precursor 10 in the vessel 29 is possible to an accuracy of +−0.5 degrees. The cooling sleeve is connected to the closed cooling water circuit via a controllable valve. Depending on the selected embodiment, it is also possible for just part of the side face of the vessel 29 to be covered with the cooling sleeve 53. The cooling sleeve 53 consists of cooling lines 55, which are arranged transversely of the longitudinal extent of the vessel 29, and thermally conductive contact surfaces 54, which are arranged perpendicular to the cooling tubes 55 and lie directly on the outside of the vessel 29. The cooling lines 55 transfer heat/cold to the contact surfaces 54. The cooling sleeve 53 enables direct proportional cooling of the vessel 29.

FIG. 3 shows a schematic cross-section of an embodiment of the second vessel 32.

The second vessel 32 substantially comprises a cylindrical outer shape and a cylindrical second chamber 16. The second chamber 16 is defined by a first housing wall 57. The first housing wall 57 takes the form of a cylindrical wall with bottom 59 and contains second cooling lines 58 for controlling the temperature of the first housing wall 57. Preferably, the second cooling line 58 is fitted both in the side walls 60 and in the bottom 59 of the first housing wall 57. The first housing wall 57 is surrounded by a second housing wall 61. The second housing wall 61 is likewise of cylindrical construction and comprises a second bottom 62. A jacket-type cavity 63 with a bottom space is formed between the first and second housing walls 57, 61. The cavity 63 is welded shut under a vacuum, such that a vacuum is present in the cavity 63 to provide thermal insulation.

The first housing wall 57 is terminated by a cover 64, wherein the second housing wall 61 is also terminated by the cover 64. The second inflow pipe 15 is guided into the second chamber 16 via the cover 64. The second inflow pipe 15 ends just above the bottom 59. A first deflection element 65 is arranged above an outlet orifice of the second inflow pipe 15. In the embodiment shown, the first deflection element 65 takes the form of a disc-shaped plate, through the middle of which the second inflow pipe 15 passes. The first deflection element 65 comprises holes for example in the form of circular areas. Depending on the selected embodiment, the first deflection element 65 may take the form of a screen with holes, in particular with circular holes. The object of the first deflection element 65 consists in subdividing the carrier gas supplied via the second inflow pipe 15 into smaller gas bubbles. This increases the surface area of the carrier gas. In the operating state a precursor 10, which is in liquid form, fills the second chamber 16 up to a desired filling level 66.

Depending on the selected embodiment, it is also possible to dispense with the first deflection element 65. Above the first deflection element 65 at least one further deflection element 67, 68, 69 is arranged. In the exemplary embodiment shown, three further deflection elements 67, 68, 69 are provided. The three further deflection elements are arranged above one another and spaced from one another and each take the form of a circular disc with a central hole, through which the second inflow pipe 15 passes. The further deflection elements 67, 68, 69 have a shape which causes the flow of carrier gas to be laterally deflected, in particular into a spiral direction of flow. The deflection elements 67, 68, 69 may here for example take the form of plates with slots. In addition, the further deflection elements may take the form of plates which have surfaces subdivided into segments of circles, wherein the surfaces are inclined relative to the plane of the further deflection element.

FIG. 4 is a schematic plan view which shows the first deflection element 65 with a plurality of round holes 77 which are for example distributed uniformly over the deflection element 65. The carrier gas rises upwards through the holes 77 and is subdivided into smaller bubbles.

FIG. 5 is a schematic view showing the first further deflection element 67 from above. The first further deflection element 67 comprises a plurality of segments of circles 70. In addition, a central orifice 71 is provided for passage of the second inflow pipe 15.

FIG. 6 is a schematic side view showing a plane 72 of the first further deflection element 67 and two segments of circles 70 of FIG. 5. The inclination of the segments of circles 70 relative to the plane 72 is clearly shown here. As a result of the inclination, the carrier gas is deflected laterally as it rises. The time taken to ascend and the distance traveled during ascent are thus increased.

The second and third further deflection elements 68, 69 may be configured in accordance with the first further deflection element 67. Furthermore, the second and third further deflection elements may also take other forms, to increase the time and/or the distance traveled by the ascending carrier gas. An additional deflection element 73 may be provided above the third further deflection element 69 and below the precursor filling level 66. The additional deflection element 73 has substantially the same shape as the first deflection element 65. Depending on the selected embodiment, the shape and/or size of the orifices may be different from the first deflection element 65.

The second outflow pipe 19 is fitted in the cover 64 above the filling level 66. In addition, the second housing 32 comprises a connection for feeding cooling liquid to the second cooling line 58. Depending on the selected embodiment, a closed cooling water circuit may be provided for the second cooling line 58, wherein the temperature of the cooling water may be precisely controlled for example by an externally arranged Peltier cooler. The temperature adjustment may be in the range of +−0.1 degree Celsius. The deflection elements 65, 66, 67, 68, 69, 73 constitute baffle plates or diffuser plates, which are intended both to enlarge the surface area of the carrier gas and also to achieve a longer residence time in the precursor and/or a longer rise distance in the precursor. Depending on the selected embodiment, a blind hole 76 may be provided, for accommodating the second temperature sensor 37 in the second inner chamber 16. Furthermore, a filling port may be provided on the second housing 32 for primary filling or large thread supply with precursor.

Depending on the selected embodiment, the temperature of the first housing 29, i.e. of the first bubbler, is controlled such that a desired precursor filling level of the second housing 32, i.e. of the second bubbler, is kept constant at 75% of the volume of the second chamber 16.

Depending on the selected embodiment, it is also possible to dispense with the cavity 63 as vacuum for insulation purposes and to provide a material insulation.

Furthermore, depending on the selected embodiment, the second bubbler, i.e. the housing 32, may also be used without the first bubbler, i.e. the first housing 29, to provide enriched carrier gas. In this embodiment, the source of the carrier gas is connected directly to the feed line 12 of the second apparatus (FIG. 1).

Although the invention has been illustrated and described in greater detail with reference to the preferred exemplary embodiment, the invention is not restricted by the disclosed examples and other variations may be derived therefrom by a person skilled in the art without going beyond the scope of protection of the invention.

The invention claimed is:

1. A method for supplying a process with an enriched carrier gas, wherein:
   a first apparatus and a second apparatus are provided,
   the first apparatus has a precursor and is configured to bring a carrier gas into contact with the precursor and to enrich said carrier gas with the precursor,
   the second apparatus has a precursor and is configured to bring a carrier gas into contact with the precursor and to enrich said carrier gas with the precursor,
   the first apparatus supplies the second apparatus with an enriched carrier gas, wherein the second apparatus supplies the enriched carrier gas for the process, and
   a temperature of the first apparatus is controlled as a function of a quantity of precursor in the second apparatus.

2. The method according to claim 1, wherein the temperature of the first apparatus is set such that more precursor is transported from the first apparatus to the second apparatus than is output for the process by the second apparatus via the enriched carrier gas.

3. The method according claim 1, wherein the temperature of the first apparatus is controlled as a function of the quantity of precursor in the first apparatus.

4. The method according to claim 1, wherein the quantity of precursor in the first and/or second apparatus is gauged as a function of the weight of the first or second apparatus respectively.

5. The method according to claim 1, wherein the temperature of the second apparatus is controlled independently of the temperature of the first apparatus.

6. The method according to claim 1, wherein a liquid precursor is provided as precursor at least in the first or the second apparatus, and wherein the apparatus with the liquid precursor takes the form of a bubbler.

7. The method of claim 1, wherein a liquid precursor, which is an organometallic precursor, is provided as precursor at least in the first or the second apparatus, and wherein the apparatus with the liquid precursor takes the form of a bubbler for enriching the carrier gas with a precursor, said bubbler comprising:
- a chamber for holding the liquid precursor;
- a temperature control means, having insulation, which is arranged on the outside of the temperature means, having an inflow pipe for supplying carrier gas, wherein the inflow pipe projects into the chamber; and
- an outflow pipe for removing the enriched carrier gas, which projects into the chamber, wherein at least one deflection element is provided between an outlet of the inflow pipe and the inlet of the outflow pipe to influence flow of the carrier gas, wherein in operation the deflection element is arranged in the liquid precursor.

8. The method of claim 7, wherein a plurality of deflection elements are arranged one above the other between an outlet orifice of the inflow pipe and an outflow orifice of the outflow pipe.

9. The method of claim 7, wherein at least one deflection element takes the form of a plate with holes.

10. The method of claim 7, wherein at least one deflection element takes the form of a plate with inclined surfaces.

11. The method of claim 10, wherein the deflection element with the holes is arranged as first deflection element above the outlet orifice of the inflow pipe.

12. The method of claim 11, wherein at least two further deflection elements are arranged above the first deflection element and below the outflow orifice of the outflow pipe, wherein the two further deflection elements take the form of plates with inclined surfaces, wherein the surfaces take the form of segments of circles.

13. The method according to claim 5, wherein the temperature of the second apparatus is controlled independently of the temperature of the first apparatus as a function of the quantity of precursor in the second apparatus and/or as a function of the volumetric flow rate of the carrier gas through the second apparatus and/or as a function of a desired saturation of the carrier gas for the process.

14. The method according to claim 6, wherein said liquid precursor is an organometallic precursor.

15. The method of claim 10, wherein said inclined surfaces take the form of segments of circles.

* * * * *